United States Patent
Hsu et al.

(10) Patent No.: US 10,134,891 B2
(45) Date of Patent: Nov. 20, 2018

(54) TRANSISTOR DEVICE WITH THRESHOLD VOLTAGE ADJUSTED BY BODY EFFECT

(71) Applicant: United Microelectronics Corp., Hsinchu (TW)

(72) Inventors: Wen-Ting Hsu, Taichung (TW); Hong-Ze Lin, Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 15/251,829

(22) Filed: Aug. 30, 2016

(65) Prior Publication Data
US 2018/0061950 A1   Mar. 1, 2018

(51) Int. Cl.
*H01L 29/78* (2006.01)
*H01L 29/10* (2006.01)
*H01L 29/423* (2006.01)

(52) U.S. Cl.
CPC ...... *H01L 29/7816* (2013.01); *H01L 29/1087* (2013.01); *H01L 29/7838* (2013.01); *H01L 29/42368* (2013.01)

(58) Field of Classification Search
CPC .................... H01L 29/7816; H01L 29/7823
See application file for complete search history.

(56) References Cited

U.S. PATENT DOCUMENTS

| | | | |
|---|---|---|---|
| 5,436,486 A * | 7/1995 | Fujishima | H01L 29/7393 257/140 |
| 5,482,888 A * | 1/1996 | Hsu | H01L 21/8238 148/DIG. 126 |
| 6,215,138 B1 * | 4/2001 | Takao | H01L 29/0696 257/286 |
| 6,528,850 B1 * | 3/2003 | Hebert | H01L 21/26513 257/331 |
| 6,614,089 B2 * | 9/2003 | Nakamura | H01L 29/0615 257/341 |
| 6,693,339 B1 * | 2/2004 | Khemka | H01L 29/0615 257/295 |
| 6,750,489 B1 | 6/2004 | Merrill | |
| 6,822,296 B2 * | 11/2004 | Wang | H02J 7/0026 257/355 |
| 6,833,586 B2 | 12/2004 | Tsuchiko | |
| 7,560,774 B1 * | 7/2009 | Liu | H01L 21/823418 257/288 |
| 7,728,388 B1 * | 6/2010 | Tsai | H01L 29/1095 257/343 |
| 9,082,841 B1 * | 7/2015 | Chang | H01L 29/78 |

(Continued)

*Primary Examiner* — Meiya Li
*Assistant Examiner* — Shih Tsun A Chou
(74) *Attorney, Agent, or Firm* — J.C. Patents

(57) ABSTRACT

A transistor device including a substrate, a gate structure, a first doped region, a second doped region and a body region is provided. The gate structure is disposed on the substrate. The first doped region and the second doped region are respectively disposed in the substrate at one side and another side of the gate structure. The first doped region and the second doped region have a first conductive type. The body region is disposed in the substrate at one side of the first doped region away from the gate structure. The body region has a second conductive type. The body region and the first doped region are separated by a distance, and no isolation structure exists between the body region and the first doped region.

13 Claims, 1 Drawing Sheet

(56) References Cited

U.S. PATENT DOCUMENTS

| | | | | |
|---|---|---|---|---|
| 9,236,471 B2* | 1/2016 | Lee | H01L 29/7816 |
| 9,391,197 B1* | 7/2016 | Pu | H01L 29/7823 |
| 9,711,643 B2* | 7/2017 | Appaswamy | H01L 29/7835 |
| 2003/0001216 A1* | 1/2003 | de Fresart | H01L 29/0653 257/409 |
| 2005/0258496 A1* | 11/2005 | Tsuchiko | H01L 27/0629 257/378 |
| 2006/0001102 A1* | 1/2006 | Pendharkar | H01L 29/1083 257/368 |
| 2006/0099764 A1* | 5/2006 | Zuniga | H01L 21/823807 438/301 |
| 2006/0202265 A1* | 9/2006 | Xu | H01L 27/0266 257/335 |
| 2006/0255430 A1* | 11/2006 | Wu | H01L 23/5225 257/605 |
| 2010/0032756 A1* | 2/2010 | Pendharkar | H01L 21/761 257/337 |
| 2010/0035388 A1* | 2/2010 | Choi | H01L 29/7816 438/151 |
| 2010/0096697 A1* | 4/2010 | Su | H01L 21/26586 257/343 |
| 2011/0079849 A1* | 4/2011 | Yan | H01L 29/0696 257/343 |
| 2011/0169093 A1* | 7/2011 | Kim | H01L 29/861 257/361 |
| 2012/0018804 A1* | 1/2012 | Khemka | H01L 29/1083 257/337 |
| 2012/0139005 A1* | 6/2012 | Ikimura | H01L 27/0623 257/139 |
| 2013/0056825 A1* | 3/2013 | Chen | H01L 21/26586 257/344 |
| 2014/0103429 A1* | 4/2014 | Chuang | H01L 29/66681 257/335 |
| 2014/0124857 A1* | 5/2014 | Jang | H01L 29/7816 257/337 |
| 2014/0145261 A1* | 5/2014 | Chen | H01L 29/7823 257/337 |
| 2014/0225192 A1* | 8/2014 | Lee | H01L 29/7816 257/339 |
| 2015/0137230 A1* | 5/2015 | Liao | H01L 29/7816 257/343 |
| 2015/0162440 A1* | 6/2015 | Ikuta | H01L 29/7816 257/139 |
| 2015/0171211 A1* | 6/2015 | Zhang | H01L 29/7816 257/337 |
| 2015/0187933 A1* | 7/2015 | Lin | H01L 29/7816 257/339 |
| 2015/0228771 A1* | 8/2015 | Chen | H01L 29/7432 257/173 |
| 2015/0243776 A1* | 8/2015 | Chen | H01L 29/0847 257/343 |
| 2015/0380402 A1* | 12/2015 | Park | H01L 29/7835 257/337 |
| 2016/0181419 A1* | 6/2016 | Ryu | H01L 29/7816 257/343 |
| 2016/0260705 A1* | 9/2016 | Ikimura | H01L 29/7835 |
| 2016/0284841 A1* | 9/2016 | Min | H01L 29/1033 |
| 2017/0317208 A1* | 11/2017 | Chin | H01L 29/7816 |

\* cited by examiner

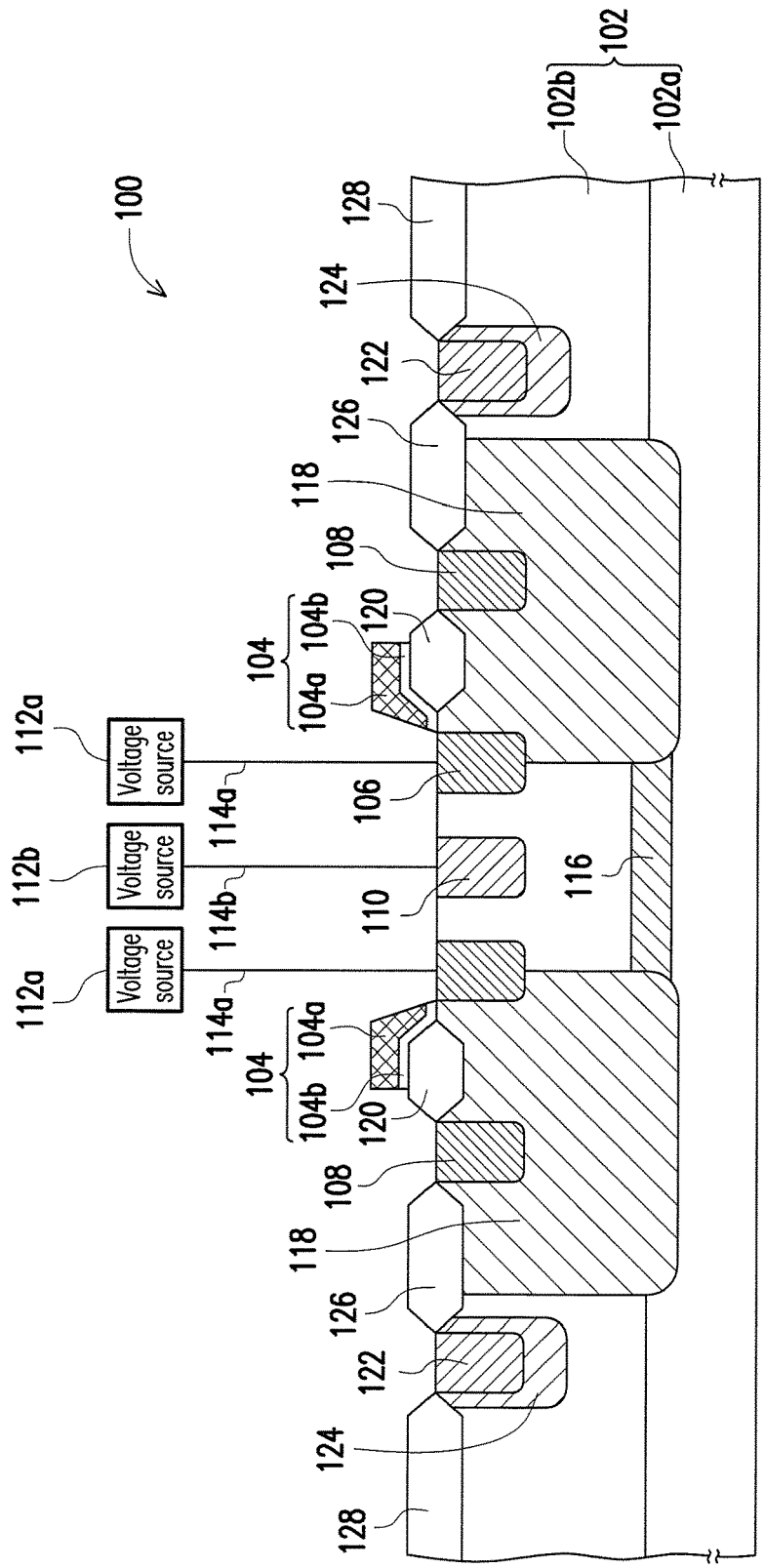

//www.w3.org/1999/xhtml">
TRANSISTOR DEVICE WITH THRESHOLD VOLTAGE ADJUSTED BY BODY EFFECT

BACKGROUND OF THE INVENTION

Field of the Invention

The invention relates to a semiconductor device, and particularly relates to a transistor device.

Description of Related Art

Many industries (such as biosensor etc.) have the demand of the threshold voltage adjustable transistor device. As a result, the semiconductor industry is actively researching and developing the threshold voltage adjustable transistor device.

SUMMARY OF THE INVENTION

The invention provides a transistor device which can have a threshold voltage adjustable function.

The invention provides a transistor device including a substrate, a gate structure, a first doped region, a second doped region and a body region. The gate structure is disposed on the substrate. The first doped region and the second doped region are respectively disposed in the substrate at one side and another side of the gate structure. The first doped region and the second doped region have a first conductive type. The body region is disposed in the substrate at one side of the first doped region away from the gate structure. The body region has a second conductive type. The body region and the first doped region are separated by a distance, and no isolation structure exists between the body region and the first doped region.

According to an embodiment of the invention, in the transistor device, the substrate can have the second conductive type.

According to an embodiment of the invention, in the transistor device, the gate structure can include a gate and a gate dielectric layer. The gate is disposed on the substrate. The gate dielectric layer is disposed between the gate and the substrate.

According to an embodiment of the invention, in the transistor device, the first conductive type is one of an N-type and a P-type, and the second conductive type is another one of the N-type and the P-type, for example.

According to an embodiment of the invention, in the transistor device, the body region and the first doped region can be electrically connected to different voltage sources.

According to an embodiment of the invention, in the transistor device, the transistor device can be a high voltage transistor device or a low voltage transistor device.

According to an embodiment of the invention, in the transistor device, the high voltage transistor device is a lateral diffused metal-oxide semiconductor (LDMOS) device or a double diffused drain metal-oxide semiconductor (DDDMOS) device, for example.

According to an embodiment of the invention, in the transistor device, the transistor device is the LDMOS device, for example.

According to an embodiment of the invention, in the transistor device, the substrate can include a substrate body and an epitaxial layer. The substrate body has the second conductive type. The epitaxial layer is disposed on the substrate body and has the second conductive type.

According to an embodiment of the invention, the transistor device can further include a buried layer. The buried layer is disposed between the substrate body and the epitaxial layer and located below the body region. The buried layer has the first conductive type.

According to an embodiment of the invention, the transistor device can further include a first well region. The first well region is disposed in the epitaxial layer and has the first conductive type. The first doped region and the second doped region are located in the first well region.

According to an embodiment of the invention, the transistor device can further include a first isolation structure. The first isolation structure is disposed in the epitaxial layer between the first doped region and the second doped region.

According to an embodiment of the invention, in the transistor device, at least a portion of the gate structure can be located on the first isolation structure.

According to an embodiment of the invention, the transistor device can further include a third doped region. The third doped region is disposed in the epitaxial layer at one side of the second doped region away from the gate structure. The third doped region has a second conductive type.

According to an embodiment of the invention, the transistor device can further include a second well region. The second well region is disposed in the epitaxial layer and has the second conductive type. The third doped region is located in the second well region.

According to an embodiment of the invention, the transistor device can further include a second isolation structure. The second isolation structure is disposed in the epitaxial layer between the second doped region and the third doped region.

According to an embodiment of the invention, the transistor device can further include a third isolation structure. The third isolation structure is disposed in the epitaxial layer at one side of the third doped region away from the second doped region.

Based on the above description, in the transistor device of the invention, the body region and the first doped region are separated by a distance, and thus the transistor device can have the threshold voltage adjustable function by using the body effect. Furthermore, since no isolation structure exists between the body region and the first doped region, the size of the transistor device can be reduced.

In order to make the aforementioned and other objects, features and advantages of the present invention comprehensible, a preferred embodiment accompanied with FIGURES is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a cross-sectional view illustrating a transistor device according to an embodiment of the invention.

DESCRIPTION OF THE EMBODIMENTS

FIG. 1 is a cross-sectional view illustrating a transistor device according to an embodiment of the invention.

Referring to FIG. 1, a transistor device 100 including a substrate 102, a gate structure 104, a doped region 106, a doped region 108 and a body region 110. The transistor device 100 can be a high voltage transistor device or a low voltage transistor device. The high voltage transistor device is a lateral diffused metal-oxide semiconductor (LDMOS) device or a double diffused drain metal-oxide semiconductor (DDDMOS) device, for example. In this embodiment, the transistor device 100 is exemplified as the LDMOS device, but the invention is not limited thereto.

Moreover, the terms "first conductive type" and "second conductive type" used in this embodiment refer to different conductive types. The first conductive type is one of an N-type and a P-type, and the second conductive type is another one of the N-type and the P-type, for example. In this embodiment, the first conductive type is exemplified as the N-type, and the second conductive type is exemplified as the P-type, but the invention is not limited thereto.

The substrate 102 is a silicon substrate, for example. The substrate 102 can have the second conductive type (for example, the P-type). The substrate 102 can include a substrate body 102a and an epitaxial layer 102b. The substrate body 102a has the second conductive type (for example, the P-type). The epitaxial layer 102b is disposed on the substrate body 102a and has the second conductive type (for example, the P-type).

The gate structure 104 is disposed on the substrate 102. The gate structure 104 can include a gate 104a and a gate dielectric layer 104b. The gate 104a is disposed on the substrate 102. The material of the gate 104a is doped polysilicon, for example. The gate dielectric layer 104b is disposed between the gate 104a and the substrate 102. The material of the gate dielectric layer 104b is silicon oxide, for example.

The doped region 106 and the doped region 108 are respectively disposed in the substrate 102 at one side and another side of the gate structure 104. The doped region 106 and the doped region 108 have the first conductive type (for example, the N-type). The doped region 106 can be used as one of a source region and a drain region, and the doped region 108 can be another one of the source region and the drain region. In this embodiment, the doped region 106 is exemplified as the source region, and the doped region 108 is exemplified as the drain region, but the invention is not limited thereto.

The body region 110 is disposed in the substrate 102 at one side of the doped region 106 away from the gate structure 104. The body region 110 has a second conductive type (for example, the P-type). The body region 110 is a doped region, for example. The body region 110 and the doped region 106 are separated by a distance, and no isolation structure exists between the body region 110 and the doped region 106. Since the body region 110 and the doped region 106 are separated by a distance, the threshold voltage of the transistor device 100 can be adjusted by using the body effect. Furthermore, since no isolation structure exists between the body region 110 and the doped region 106, the size of the transistor device 100 can be reduced.

The body region 110 and the doped region 106 can be electrically connected to different voltage sources. Therefore, the voltages applied to the body region 110 and the doped region 106 can be independently controlled. For example, the doped region 106 can be electrically connected to a voltage source 112a by an interconnect 114a, and the body region 110 can be electrically connected to a voltage source 112b by an interconnect 114b. The interconnect 114a and 114b respectively include a contact, a conductive line or a combination thereof.

The transistor device 100 can further include at least one of a buried layer 116, a well region 118, an isolation structure 120, a doped region 122, a well region 124, an isolation structure 126 and an isolation structure 128.

The buried layer 116 is disposed between the substrate body 102a and the epitaxial layer 102b and located below the body region 110. The buried layer 116 has the first conductive type (for example, the N-type). The buried layer 116 is a doped region, for example.

The well region 118 is disposed in the epitaxial layer 102b and has the first conductive type (for example, the N-type). The doped region 106 and the doped region 108 are located in the well region 118.

The isolation structure 120 is disposed in the epitaxial layer 102b between the doped region 106 and the doped region 108. At least a portion of the gate structure 104 can be located on the isolation structure 120. The isolation structure 120 is a field oxide or a shallow trench isolation (STI). In this embodiment, the isolation structure 120 is exemplified as the field oxide, but the invention is not limited thereto. The material of the isolation structure 120 is silicon oxide, for example.

The doped region 122 is disposed in the epitaxial layer 102b at one side of the doped region 108 away from the gate structure 104. The doped region 122 can be used as a pick-up region. The doped region 122 has a second conductive type (for example, the P-type).

The well region 124 is disposed in the epitaxial layer 102b and has the second conductive type (for example, the P-type). The doped region 122 is located in the well region 124.

The isolation structure 126 is disposed in the epitaxial layer 102b between the doped region 108 and the doped region 122. The isolation structure 126 is a field oxide or a STI. In this embodiment, the isolation structure 126 is exemplified as the field oxide, but the invention is not limited thereto. The material of the isolation structure 126 is silicon oxide, for example.

The isolation structure 128 is disposed in the epitaxial layer 102b at one side of the doped region 122 away from the doped region 108. The isolation structure 128 is a field oxide or a STI. In this embodiment, the isolation structure 128 is exemplified as the field oxide, but the invention is not limited thereto. The material of the isolation structure 128 is silicon oxide, for example.

Furthermore, the gate structure 104, the doped region 106, the doped region 108, the well region 118, the isolation structure 120, the doped region 122, the well region 124, the isolation structure 126 and the isolation structure 128 can respectively have a ring-shape in the top view, and thus the transistor device 100 can have a symmetric structure in the cross-sectional view of the FIG. 1.

Based on the aforementioned embodiment, in the transistor device 100, the body region 110 and the doped region 106 are separated by a distance, and thus the transistor device 100 can have the threshold voltage adjustable function by using the body effect. Furthermore, since no isolation structure exists between the body region 110 and the doped region 106, the size of the transistor device 100 can be reduced.

In summary, the transistor device of the aforementioned embodiment can have the threshold voltage adjustable function and have the smaller size.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A transistor device, comprising:
a substrate;
a gate structure, disposed on the substrate;
a first doped region and a second doped region, respectively disposed in the substrate at one side and another side of the gate structure, and having a first conductive type; and
a body region, disposed in the substrate at one side of the first doped region away from the gate structure, and having a second conductive type, wherein
the body region and the first doped region are separated by a distance, and no isolation structure exists between the body region and the first doped region,
the substrate comprises: a substrate body having the second conductive type, and an epitaxial layer disposed on the substrate body and having the second conductive type,
the transistor device further comprises: a third doped legion, disposed in the epitaxial layer at one side of the second doped region away from the gate structure, and having the second conductive type,
there is no gate structure between the second doped region and the third doped region,
the transistor device is symmetric with respect to an axis passing through the body region and along a normal direction of the substrate,
the transistor further comprises a first well region, disposed in the epitaxial layer and having the first conductive type,
the first doped region is disposed partially within the first well region, while the body region is disposed within the epitaxial layer, and
the body region and the first doped region do not have any other doped region disposed therein between besides the epitaxial layer.

2. The transistor device of claim 1, wherein the substrate has the second conductive type.

3. The transistor device of claim 1, wherein the gate structure comprises:
a gate, disposed on the substrate; and
a gate dielectric layer, disposed between the gate and the substrate.

4. The transistor device of claim 1, wherein the first conductive type is one of an N-type and a P-type, and the second conductive type is another one of the N-type and the P-type.

5. The transistor device of claim 1, wherein the body region and the first doped region are electrically connected to different voltage sources.

6. The transistor device of claim 1, wherein the transistor device comprises a lateral diffused metal-oxide semiconductor (LDMOS) device or a double diffused drain metal-oxide semiconductor (DDDMOS) device.

7. The transistor device of claim 6, wherein the transistor device is the LDMOS device.

8. The transistor device of claim 1, further comprising:
a buried layer, disposed between the substrate body and the epitaxial layer and located below the body region, wherein the buried layer has the first conductive type.

9. The transistor device of claim 1, further comprising:
a first isolation structure, disposed in the epitaxial layer between the first doped region and the second doped region.

10. The transistor device of claim 9, wherein at least a portion of the gate structure is located on the first isolation structure.

11. The transistor device of claim 1, further comprising:
a second well region, disposed in the epitaxial layer and having the second conductive type, wherein
the third doped region is located in the second well region.

12. The transistor device of claim 1, further comprising:
a second isolation structure, disposed in the epitaxial layer between the second doped region and the third doped region.

13. The transistor device of claim 1, further comprising:
a third isolation structure, disposed in the epitaxial layer at one side of the third doped region away from the second doped region.

* * * * *